United States Patent

McNeil et al.

[11] Patent Number: 5,867,276
[45] Date of Patent: Feb. 2, 1999

[54] METHOD FOR BROAD WAVELENGTH SCATTEROMETRY

[75] Inventors: John R. McNeil; Scott R. Wilson, both of Albuquerque, N. Mex.; Richard H. Krukar, Fremont, Calif.

[73] Assignee: Bio-Rad Laboratories, Inc., Hercules, Calif.

[21] Appl. No.: 814,736

[22] Filed: Mar. 7, 1997

[51] Int. Cl.[6] .............................. G01N 21/47; G01B 9/02
[52] U.S. Cl. ......................... 356/445; 356/355; 356/446
[58] Field of Search .................................. 356/445, 446, 356/355

[56] References Cited

U.S. PATENT DOCUMENTS

| | | | |
|---|---|---|---|
| 4,710,642 | 12/1987 | McNeil | 356/445 X |
| 5,164,790 | 11/1992 | McNeil et al. | 356/355 |
| 5,241,369 | 8/1993 | McNeil et al. | 356/445 |
| 5,703,692 | 12/1997 | McNeil et al. | 356/445 |

OTHER PUBLICATIONS

Raymond, Christopher J. et al., "Metrology of subwavelength photoresist gratings using optical scatterometry", *Journal of Vacuum Science and Technology* B 13(4), Jul./Aug., 1995 (pp. 1484–1495).

Murnane, Michael R. et al., "Developed photoresist metrology using scatterometry", SPIE, vol. 2196 (pp. 47–59). No Date.

Murnane, Michael R. et al., Scatterometry for 0.24 um—0.70 um developed photoresist metrology, SPIE, 1995.

S.S.H. Naqvi et al., "Etch depth estimation of large–period silicon gratings with multivariate calibration of rigorously simulated diffraction profiles", *Journal of the Optical Society of America*, vol. II, No. 9, Sep. 1994 (pp. 2485–2493).

Hatab, Ziad R. et al., "Sixteen–megabit dynamic random access memory trench depth characterization using two–dimensional diffraction analysis", *Journal of Vacuum Science and Technology*, B 13(2), Mar./Apr. 1995 (pp. 174–182).

*Primary Examiner*—Vincent P. McGraw
*Attorney, Agent, or Firm*—William E. Hein

[57] ABSTRACT

An optical scatterometer system enables analysis of a sample material at various wavelengths without rotating or otherwise moving the sample material.

11 Claims, 12 Drawing Sheets

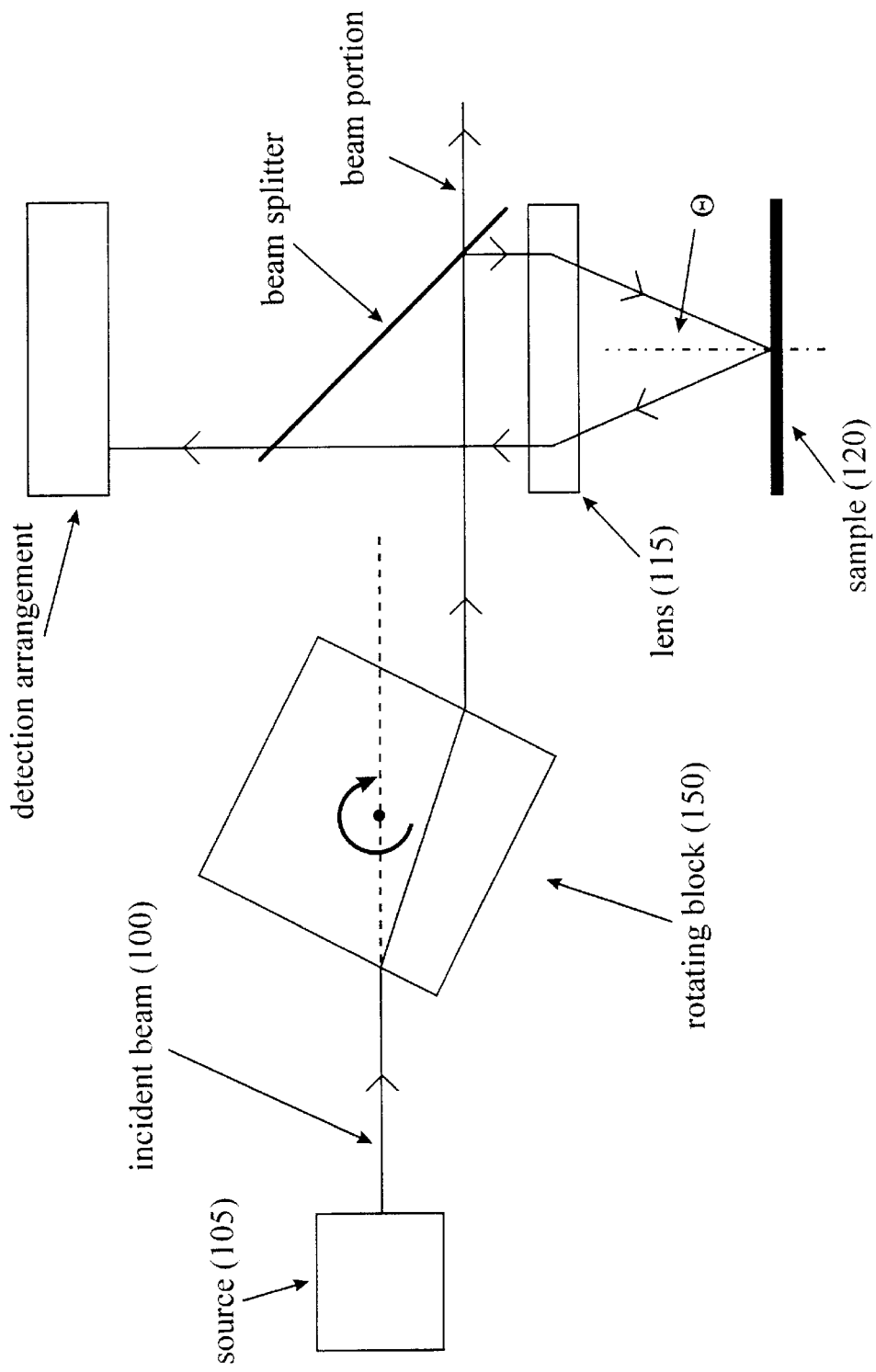

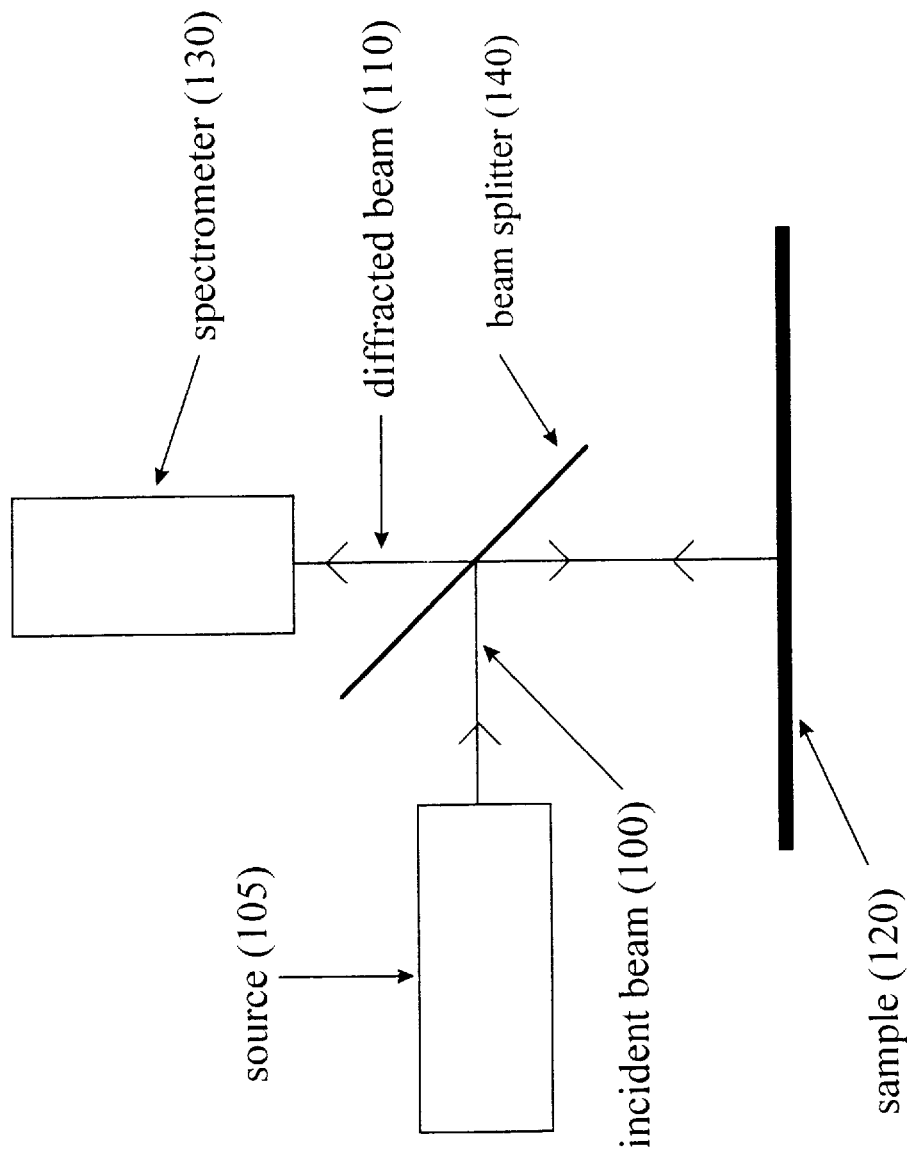

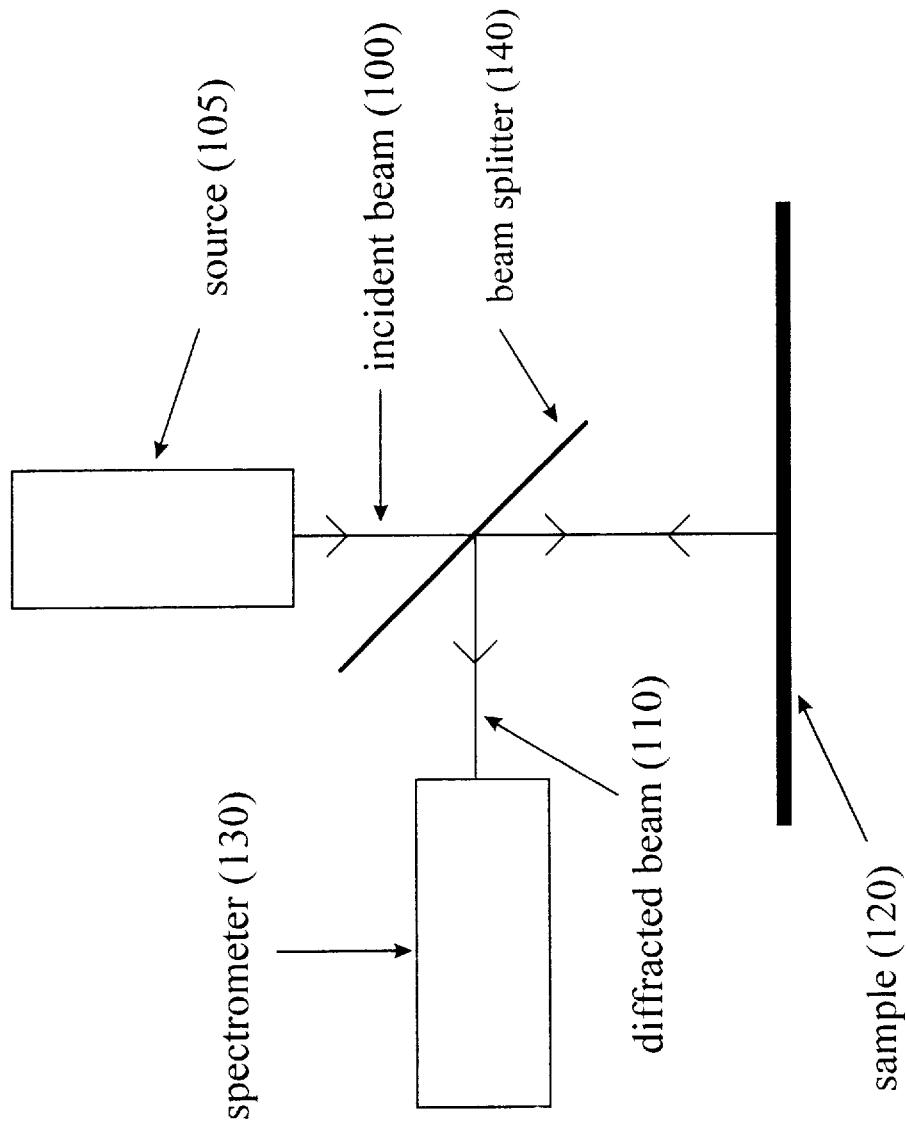

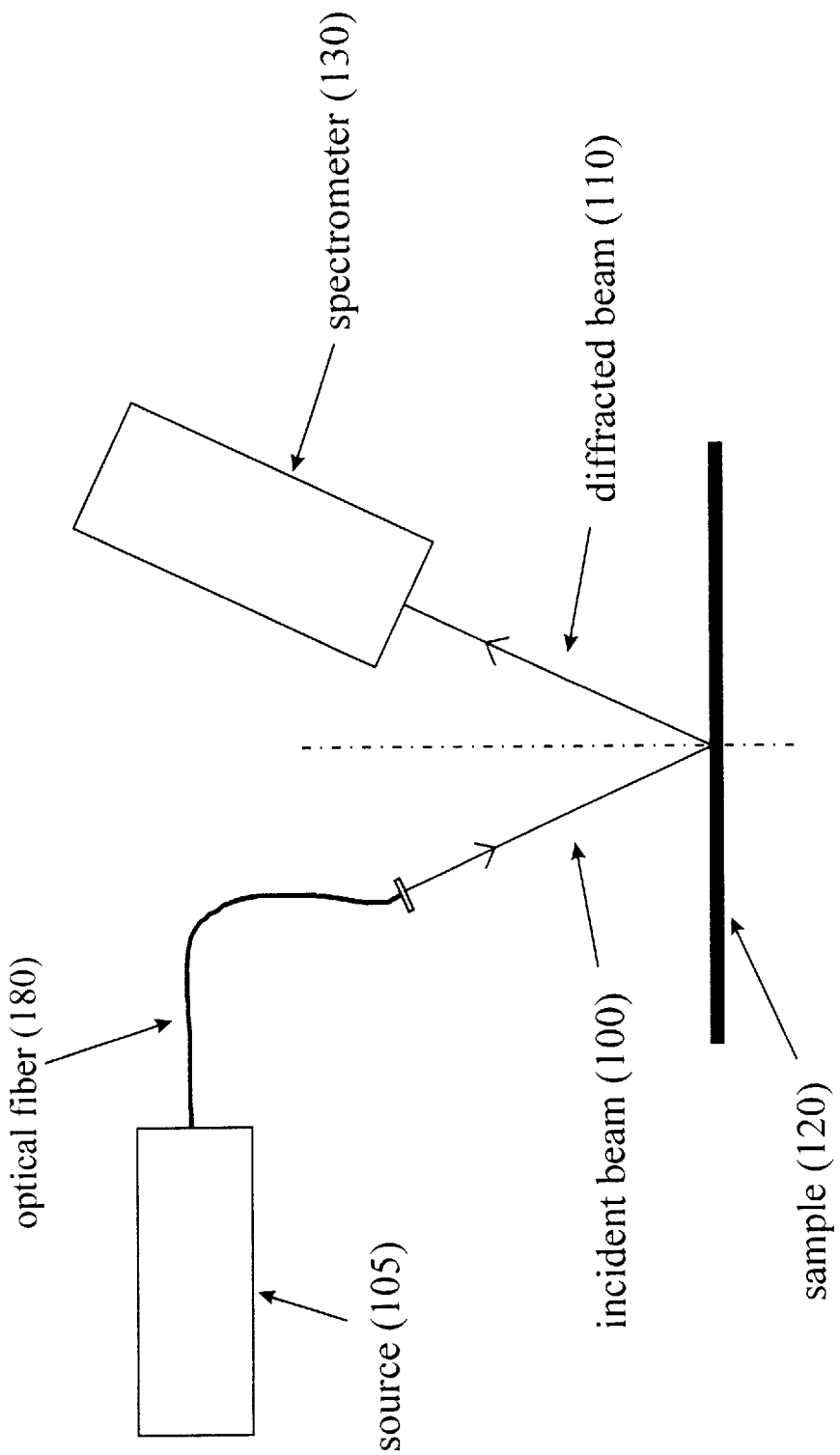

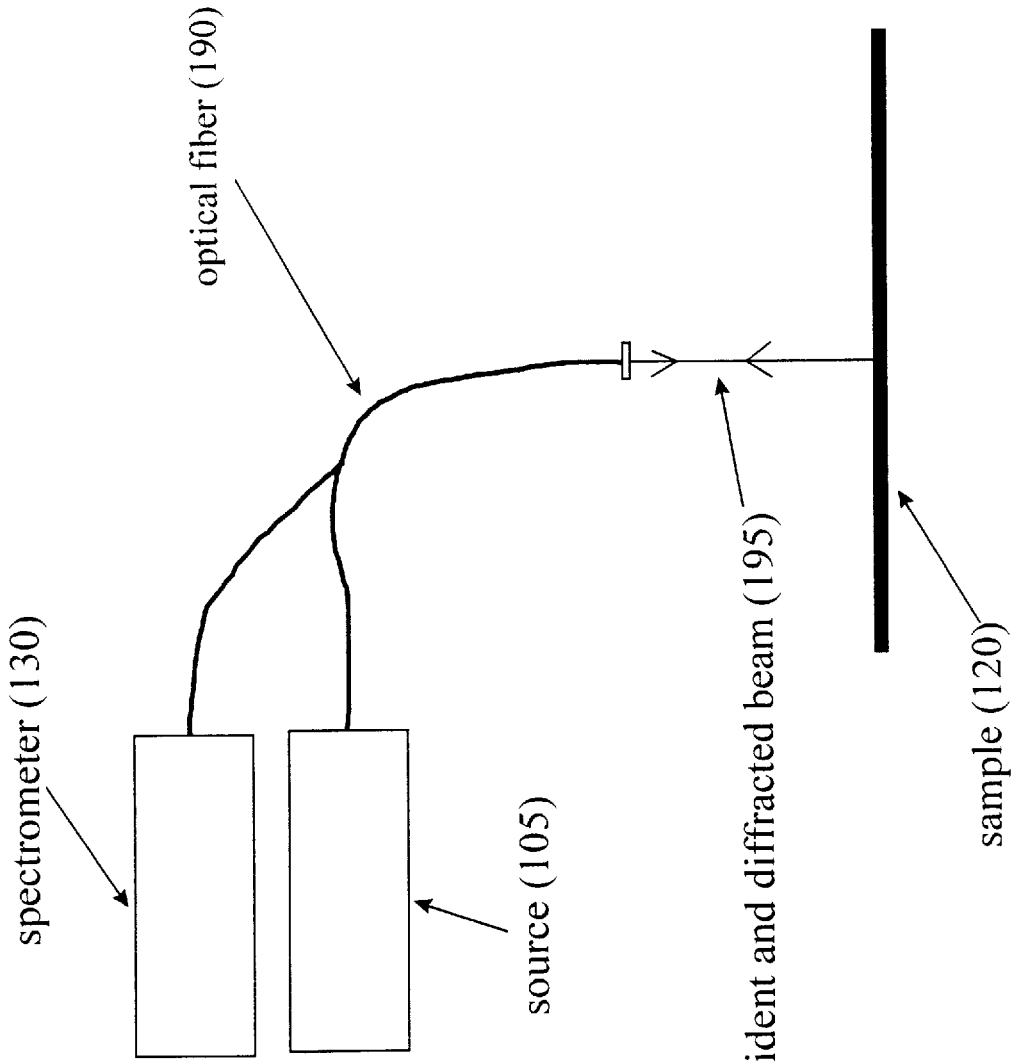

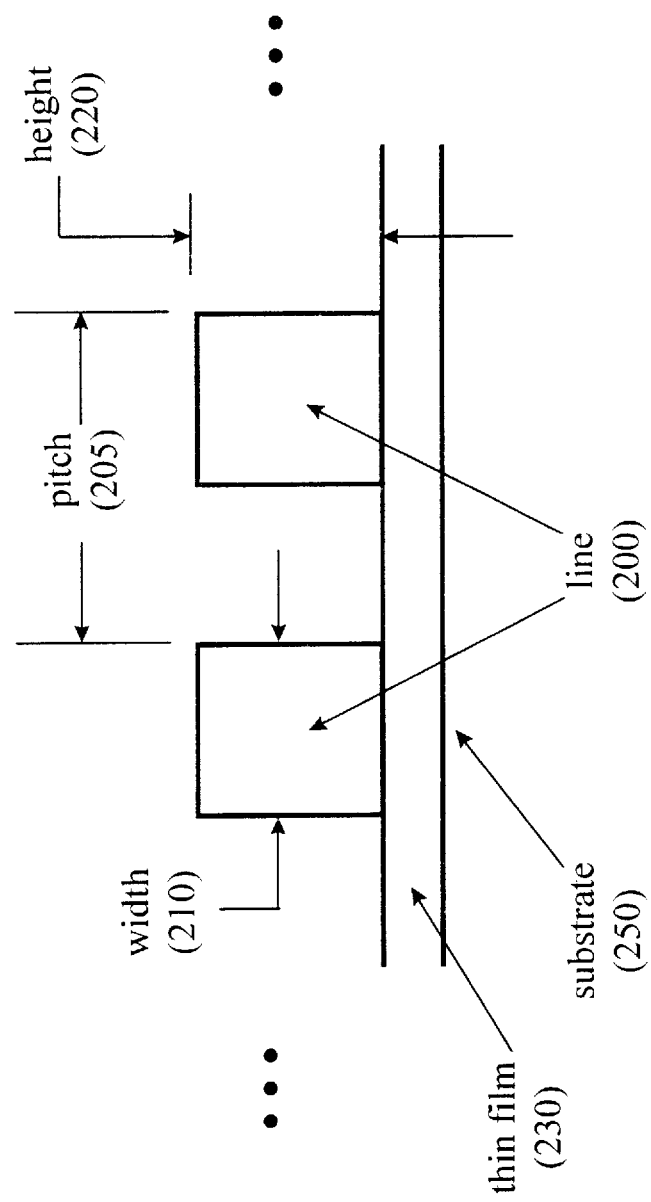

METHOD FOR BROAD WAVELENGTH SCATTEROMETRY

REFERENCE TO RELATED PATENTS

This application is related to and incorporates by reference the subject matter of U.S. Pat. Nos. 4,710,642, 5,164,790, 5,241,369, and pending application Ser. No. 08/510,990, filed Aug. 3, 1995.

BACKGROUND AND SUMMARY OF THE INVENTION

This invention relates generally to scatterometer analysis and more particularly to a scatterometer method that provides a practical means for analysis of a sample which eliminates the requirement of rotating, tilting or otherwise moving the sample during the course of a scatterometer measurement.

Scatterometer arrangements, like those described in the prior art patents and patent application cited above, have been used for characterizing the microstructure of microelectronic and optoelectronic semiconductor materials, computer hard disks, optical disks, finely polished optical components, and other materials having lateral dimensions in the range of tens of microns to less than one-tenth-micron.

Exemplary of the prior art are three publications. The first is by Michael R. Murnane, et.al., "Developed Photoresist Metrology Using Scatterometry", Proceedings of the SPIE, Integrated Circuit Metrology, Inspection, and Process Control VIII, Vol 2196, pp 47–59 (1994); the second is by Michael R. Murnane, et. al., "Scatterometry for 0.24 $\mu$m–0.70 $\mu$m Developed Photoresist Metrology", Proceedings of the SPIE, Integrated Circuit Metrology, Inspection, and Process Control IX, Vol 2439, pp 427–436 (1995); the third is by Christopher J. Raymond, et. al., "Metrology of Subwavelength Photoresist Gratings Using Optical Scatterometry", Journal of Vacuum Science and Technology, B, Vol 13(4), July/August, pp 1484–1495 (1995). This referenced prior art extends the capability of the scatterometer measurements to enable characterization of structure having lateral dimensions that are sub-micron. The prior art scatterometer arrangement discussed in the literature is disadvantageous in that it requires rotation of the sample while performing a scatterometer measurement. This requirement precludes their use in applications in which the sample must remain stationary. In addition, the rotation stages employed in this prior art scatterometer represents a mechanical complexity, which can result in undesirable optical and mechanical misalignment. Finally, the sample rotation required in this prior art scatterometer necessitates increased sample handling, thus increasing the risk of damage to the sample.

It is therefore the principle object of the present invention to provide a scatterometer method that provides a practical means of sample analysis, This is accomplished by illuminating the sample with light that has a broad spectral composition, characterizing the spectral composition of the light that is diffracted from the sample, and analysis of the diffracted light using techniques that are based upon multivariate statistical techniques and theoretical techniques; collectively the elements of this method eliminates the requirement to rotate or otherwise move the sample.

BRIEF DESCRIPTION OF THE DRAWINGS

FIG. 2 is a pictorial diagram illustrating a prior art scatterometer system employing a lens, beam splitter, rotating block, and light detection system for characterizing the light that is diffracted from the sample.

FIG. 3b is a pictorial of a scatterometer system in accordance with the present invention, illustrating the use of an incident beam source, a spectrometer, and a beam splitter for characterizing the light that is diffracted from the sample.

FIG. 3c is a pictorial of a scatterometer system in accordance with the present invention, illustrating the use of an incident beam source, a spectrometer, and a beam splitter for characterizing the light that is diffracted from the sample.

FIG. 4a is a pictorial diagram of a scatterometer system in accordance with the present invention, illustrating the use of an incident beam source, an optical fiber, and a spectrometer for characterizing the light that is diffracted from the sample.

FIG. 4d is a pictorial diagram of a scatterometer system in accordance with the present invention, illustrating the use of an incident beam source, an optical fiber, and a spectrometer for characterizing the light that is diffracted from the sample.

FIG. 5a is a pictorial diagram illustrating a cross-sectional view of a sample which would be characterized in accordance with the present invention, illustrating the sample parameters of interest.

DETAILED DESCRIPTION OF THE PREFERRED EMBODIMENTS

The present invention may be understood by first realizing that scatterometry analysis is a two-step metrology technique used to determine the dimensional properties of a sample. In the first step, termed the forward grating diffraction problem, a sample having periodic structure (i.e. a grating) is illuminated with light, and the diffracted light is measured. The apparatus that is used to perform this step, both the illumination and the measurement of diffracted light, can take many forms, two of which are described below in connection with the prior art. The second step, termed the inverse grating diffraction problem, involves analysis of the diffracted light measurements to determine the sample parameters of interest. While in general the analysis of this invention can be accomplished in several ways, description herein utilizes multivariate statistical techniques and rigorous coupled wave theory (RCWT). Use of the term sample parameters is understood to refer to the optical and dimensional properties of the individual, repeated elements which comprise the periodic structure of the sample and the thickness of underlying films, if there are any present in the sample. If the periodic structure comprises a simple line/space pattern, characteristic of a diffraction grating, the parameters of interest include the width of the lines, their height, their sidewall angle, and possibly more subtle structural details. If the periodic structure is more complex, such as one having two-dimensional periodicity or one in which the repeated elements are not comprised of line/space patterns, the parameters of interest might include those previously mentioned or other similar dimensional properties, such as a hole diameter or depth. An example of the latter type of sample is a DRAM structure utilized in microelectronics. The term optical properties is understood to include the complex refractive index of the sample materials.

Figure 1:
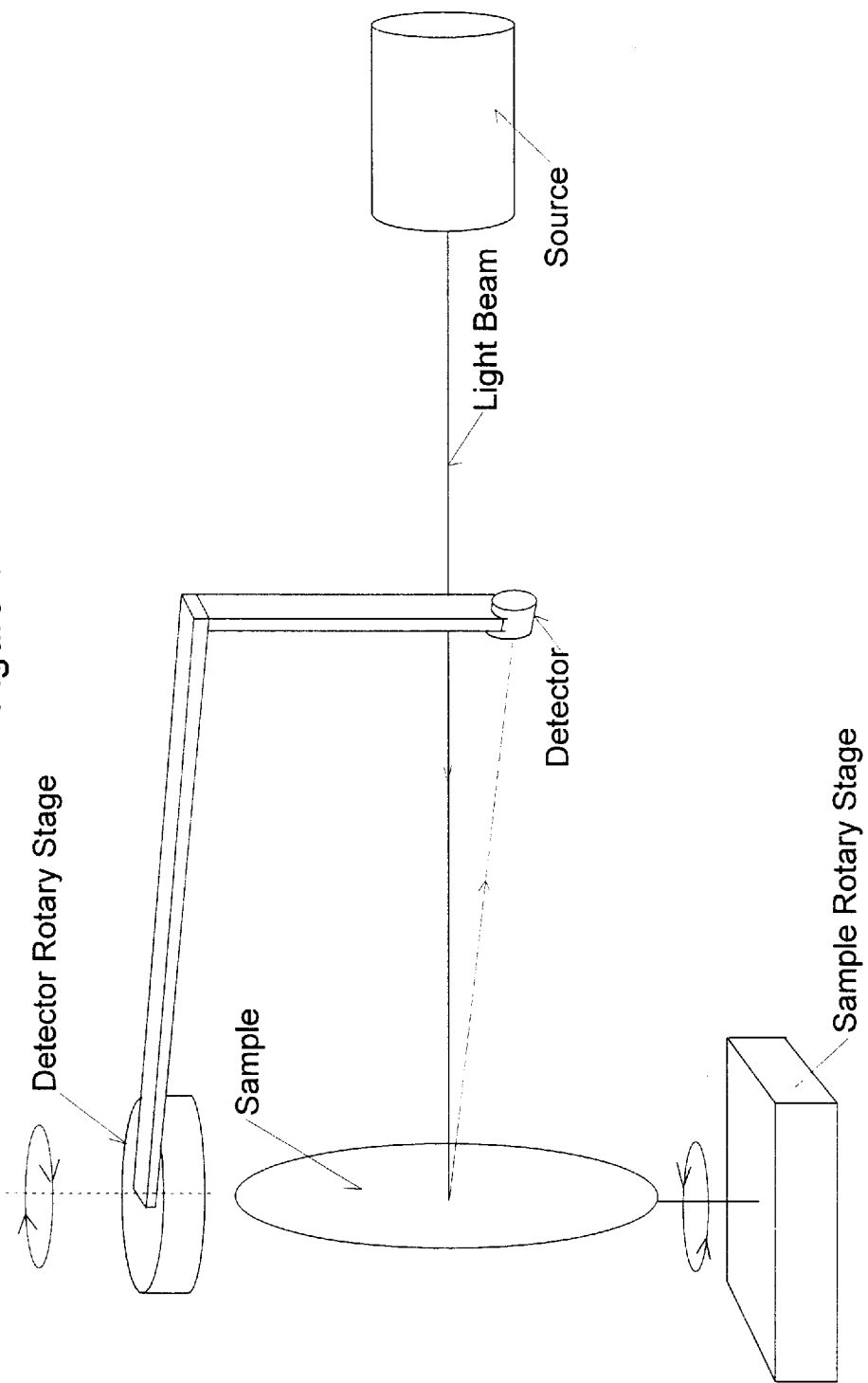
FIG. 1 is a pictorial diagram illustrating a prior art scatterometer system employing a single detector and two rotation stages to move both the sample and the detector.

The apparatus used to perform the forward grating diffraction problem may be understood by referring to the prior art scatterometer systems illustrated in FIG. 1, hereafter referred to as the 2-Θ scatterometer arrangement, and FIG. 2, hereafter referred to as the lens scatterometer system. In the 2-Θ scatterometer arrangement illustrated in FIG. 1, two rotational stages are incorporated. One stage, called the "sample stage" is utilized to rotate the sample, and one stage, called the "detector stage" is utilized to rotate a detector. Typically in this 2-Θ scatterometer arrangement the rotation axes of the two stages are coincident, although this is not required. The sample is illuminated with a light beam that is incident on the sample at a point that is also on the rotation axis of the sample; in other words the front surface of the sample contains the axis of rotation of this sample stage. In this manner the angle of incidence of the light illuminating the sample can be made to vary over a range in a desired manner, and this can be controlled, for example, by a computer that is connected to the sample stage. Further, as the angle of incidence is changed by activating the sample stage, the detector stage is activated to move the detector in a desired manner. The two stages are activated either simultaneously, or practically simultaneously.

As explained previously, the 2-Θ scatterometer arrangement is especially useful for characterizing the light scattered and diffracted from samples which are comprised of structure that is periodic. When monochromatic, plane wave light is incident upon the periodic structure, the light is diffracted into orders at angles governed by the simple grating equation, $$\sin \Theta + \sin \Theta' = n\lambda/d.$$

In this expression, $\Theta$ is the angle of incidence of the light, $\Theta'$ is the angle made by the diffraction order, n is the order number, $\lambda$ is the wavelength of the light, and d is the period or pitch of the structure that is illuminated. This relationship is well known and discussed in text books on optics.

The 2-Θ scatterometer thus monitors the intensity of a single diffraction order as a function of the angle of incidence of the illuminating light beam. The intensity variation of the 0-order as well as higher diffraction orders from the sample can be monitored in this manner, and this provides information which is useful for determining the properties of the sample which is illuminated. Because the properties of a sample are determined by the process used to fabricate the sample, the information is also useful as an indirect monitor of the process. This methodology is described in the literature of semiconductor processing.

Note that the light beam used to illuminate the sample might be the output from a laser or it might be some other appropriate beam of radiation that can be directed to illuminate the sample. Typically continuous, low power lasers such as He—Ne, Ar-ion, He—Cd and semiconductor diodes are used for the source of the light beam, although other sources of radiation might be used equally well in the scatterometer arrangement described here. The wavelength of the sources might range from x-ray through the visible and microwave regions, to the long wavelength region which corresponds to frequencies of just a few Hz. Generally, larger wavelengths provide for characterizing samples that have structure of larger dimensions. The following discussion will use the terminology "beam" or "light beam" to refer to the radiation that illuminates the sample that is within this wavelength region. Similarly, it is understood that the different diffraction orders that result from illuminating the sample with the beam will also be called "diffracted beams".

A shortcoming of the prior art 2-Θ scatterometer arrangement illustrated in FIG. 1 is that the sample must be rotated in the process of performing a scatterometer measurement. The angular range over which the sample is rotated in this prior art configuration is typically 40 degrees or more, and in some applications of the 2-Θ scatterometer arrangement the sample must be rotated ±40 degrees or more (i.e. a total of 80 degrees or more). Because the axis of rotation of the sample is parallel to, and included in the surface of the sample, this rotation precludes application of the prior art 2-Θ scatterometer arrangement in situations in which the sample must necessarily be stationary. This occurs practically at all steps in processing many materials, including semiconductor materials, storage media, and the like. For example, in processing semiconductor wafers in a vacuum environment, in which the wafer can not be moved existing processing equipment and associated processing techniques would require extensive modification to accommodate wafer rotation. Such modifications would be impractical.

Additionally, the two rotation stages utilized in the prior art 2-Θ scatterometer arrangement represent mechanical complexity. Eliminating one or both of them would represent a significant simplification in maintaining optical and mechanical alignment.

Another shortcoming of the sample rotation in implementing the prior art 2-Θ scatterometer arrangement illustrated in FIG. 1 is that the two stages involve mechanical motion, and this generates particulate contamination. Because the sample is located near the stages, contamination levels on the sample can increase because of this.

Finally, sample rotation in the prior art configuration of FIG. 1 requires increased levels of sample handling, which in turn increases the risk of damaging the sample. The sample must be fixed in a holder that will sufficiently secure the sample for rotation, and this involves more handling of the sample compared to an arrangement in which the sample is stationary. Similarly, increased handling requires more time before the sample can be examined.

FIG. 2 illustrates the prior art scatterometer arrangement known as the lens scatterometer system. The system utilizes a rotating block (150) to provide a means of translating the beam from the source (105) to different points of the entrance aperture of the lens (115), and thus to illuminate the sample (120) at different angles of incidence, Θ. This arrangement, and the similar arrangements described in the patent application Ser. No. 08/510,990, represent an improvement over the 2-Θ scatterometer. The lens scatterometer arrangements provide a means of changing the angle of incidence, Θ, of the beam at the sample (120) without moving the sample (120).

A shortcoming of the lens scatterometer system illustrated in FIG. 2 is that one or more elements, such as the rotating block (150) move, and this can be problematic for the same reasons described previously concerning contamination of the sample. Additionally, it is desirable to eliminate moving elements of the scatterometer for simplicity of construction.

The method of the present invention has three principle components which, collectively, comprise the invention: the sample illumination, measurement, and analysis components. The first two components comprise apparatus utilized in the forward grating diffraction problem, and the analysis component is utilized in the inverse grating diffraction problem.

Figure 3A:
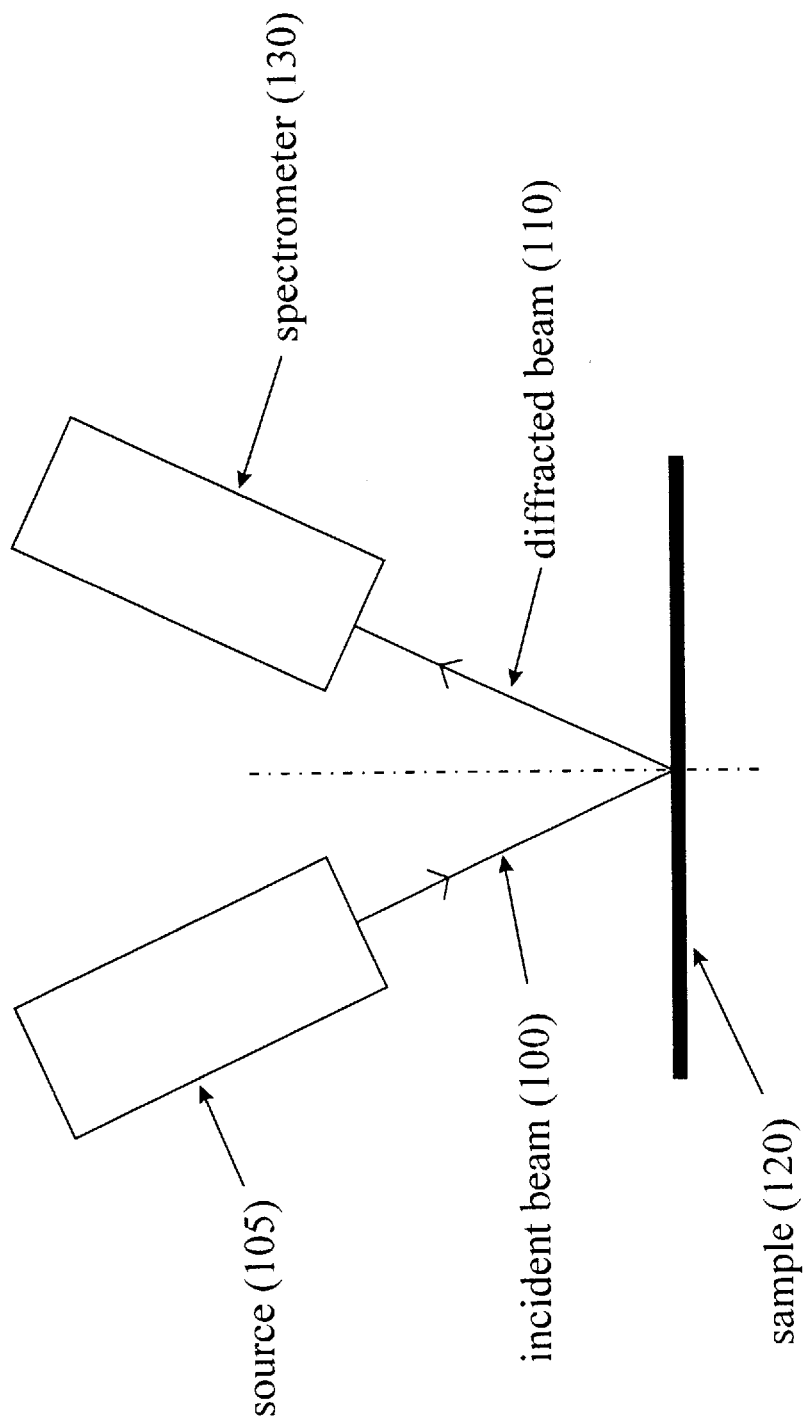
FIG. 3a is a pictorial diagram of a scatterometer system in accordance with the present invention, illustrating the use of an incident beam source and a spectrometer for characterizing the light that is diffracted from the sample.

Sample Illumination: FIGS. 3 and 4 illustrate apparatus that is suitable for use as the illumination and measurement components. In FIG. 3a, a source (105) is utilized to provide the incident beam (100) that has a broad spectral composition. More specifically, the spectral characteristics of the source are such that the light intensity changes slowly with respect to changes in wavelength. Representative light sources include commonly available incandescent (e.g., tungsten filament), high pressure Xe, and halogen lamps. This type of source is to be contrasted with lasers and low pressure discharge lamps which have output at one or more wavelengths that extend over a relatively narrow wavelength range. Alternatively, the source (105) might comprise multiple wavelengths from one or more lasers or light emitting diodes which, collectively, provide a source (105) that has a broad spectral composition.

Sample Measurement: In the arrangement illustrated in FIG. 3a, the incident beam (100) from the source (105) illuminates the sample (120) at some non-zero angle of incidence, and the sample diffracts a portion of the incident light, thus producing the diffracted beam (110). All of the diffracted beam (110) or a portion of the diffracted beam (110) enters the spectrometer (130), which provides information representative of the spectral content of the diffracted beam (110). The spectrometer (130) might comprise any instrument that contains one or more dispersive optical elements which is capable of providing spectrally-resolved information concerning the diffracted beam (110). Note that the diffracted beam (110) might consist of one or more of the 0-order and higher order (e.g., ±1st-order, ±2nd-order, etc.) diffraction contributions at wavelengths throughout all, or a portion of the spectral range of the incident beam (100); this composition is dependent upon the sample structure and the spectral characteristics of the incident beam (100). The portion of the diffracted beam which enters the spectrometer (130) for analysis is determined by the sample and its associated diffraction characteristics, the spatial extent of the diffracted beam (110), the spectrometer (130) properties, and any associated optical elements that might be used in conjunction with the spectrometer (130).

Figure 3D:
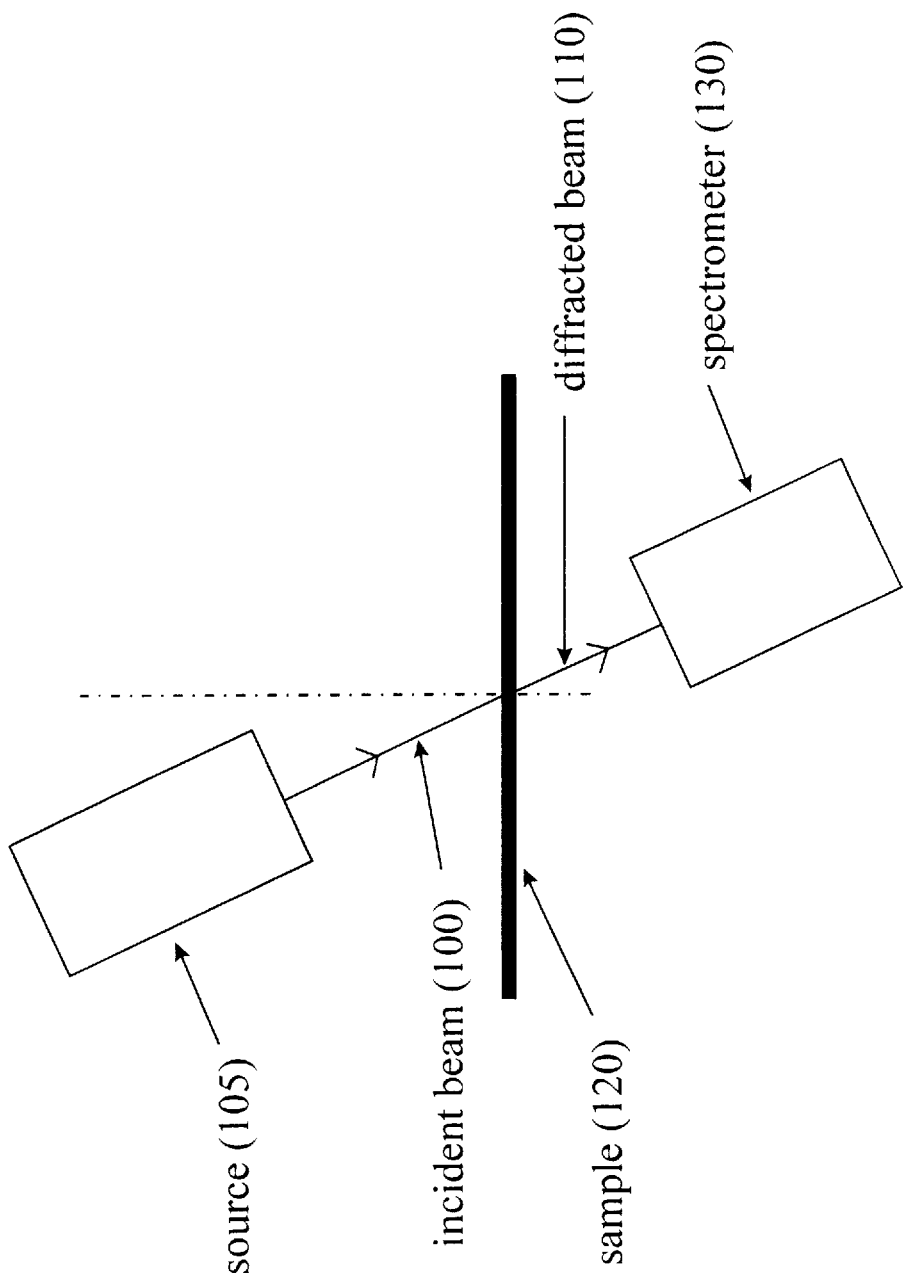
FIG. 3d is a pictorial diagram of a scatterometer system in accordance with the present invention, illustrating the use of an incident beam source and a spectrometer for characterizing the light that is diffracted from the sample.

FIG. 3b illustrates an arrangement that is similar in function to that illustrated in FIG. 3a which provides for the incident beam (100) to be perpendicular to the sample (120), i.e., zero angle of incidence. The beam splitter (140) directs the incident beam (100) to the sample (140); the diffracted beam (110) is partially transmitted by the beam splitter (140); and all or a portion of the diffracted beam (110) enters the spectrometer (130). Alternatively, the source (105) and the spectrometer (130) can be interchanged to provide the arrangement illustrated in FIG. 3c which functions in essentially the same manner as that illustrated in FIG. 3b. FIG. 3d illustrates an arrangement that accommodates samples which are partially or fully transparent. In the arrangement of FIG. 3d the diffracted beam (110) exits the side of the sample (120) opposite to that of the incident beam (105), and all or a portion of the diffracted beam (110) enters the spectrometer (130), as previously described.

Figure 4B:
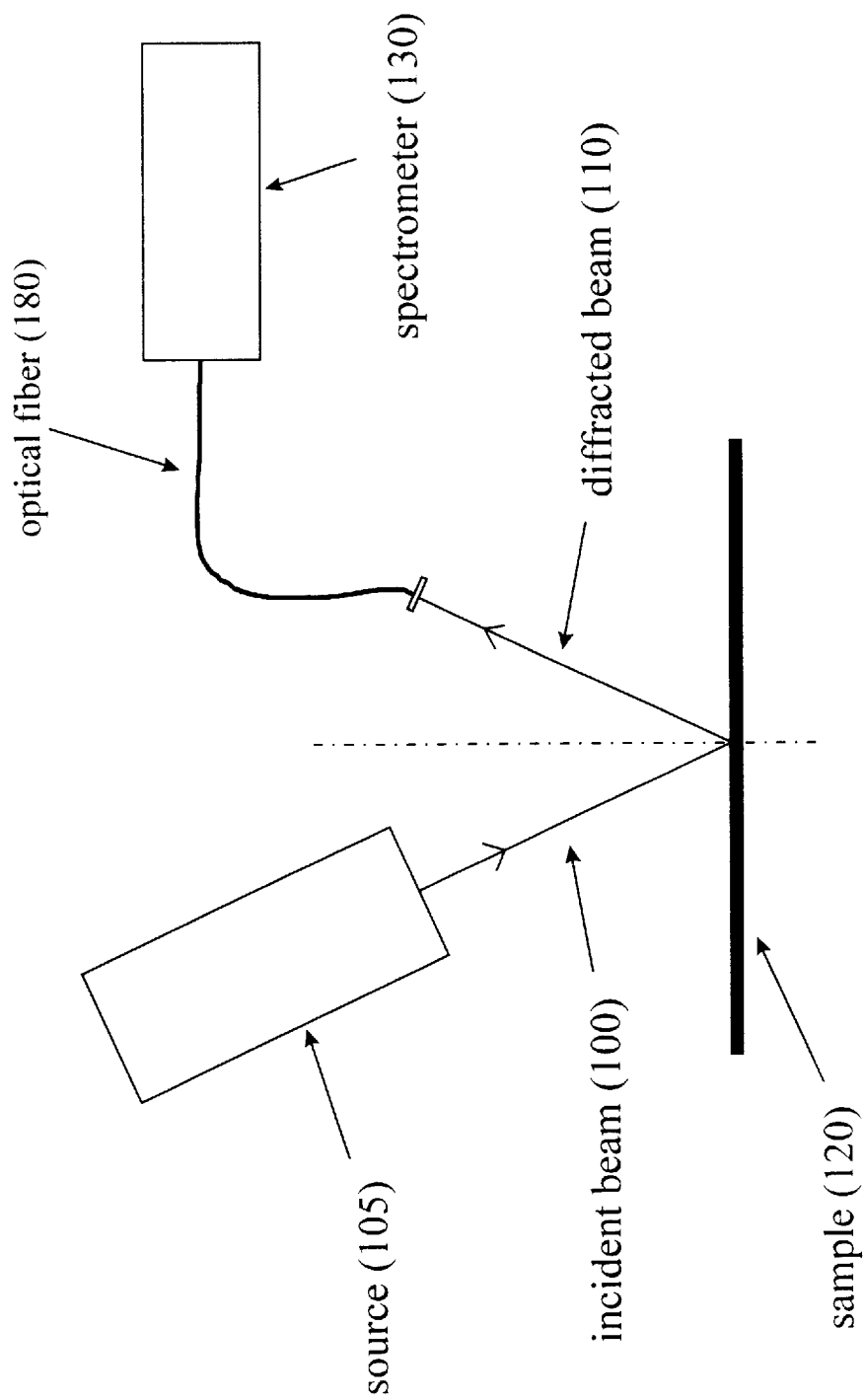
FIG. 4b is a pictorial diagram of a scatterometer system in accordance with the present invention, illustrating the use of an incident beam source, an optical fiber, and a spectrometer for characterizing the light that is diffracted from the sample.
Figure 4C:
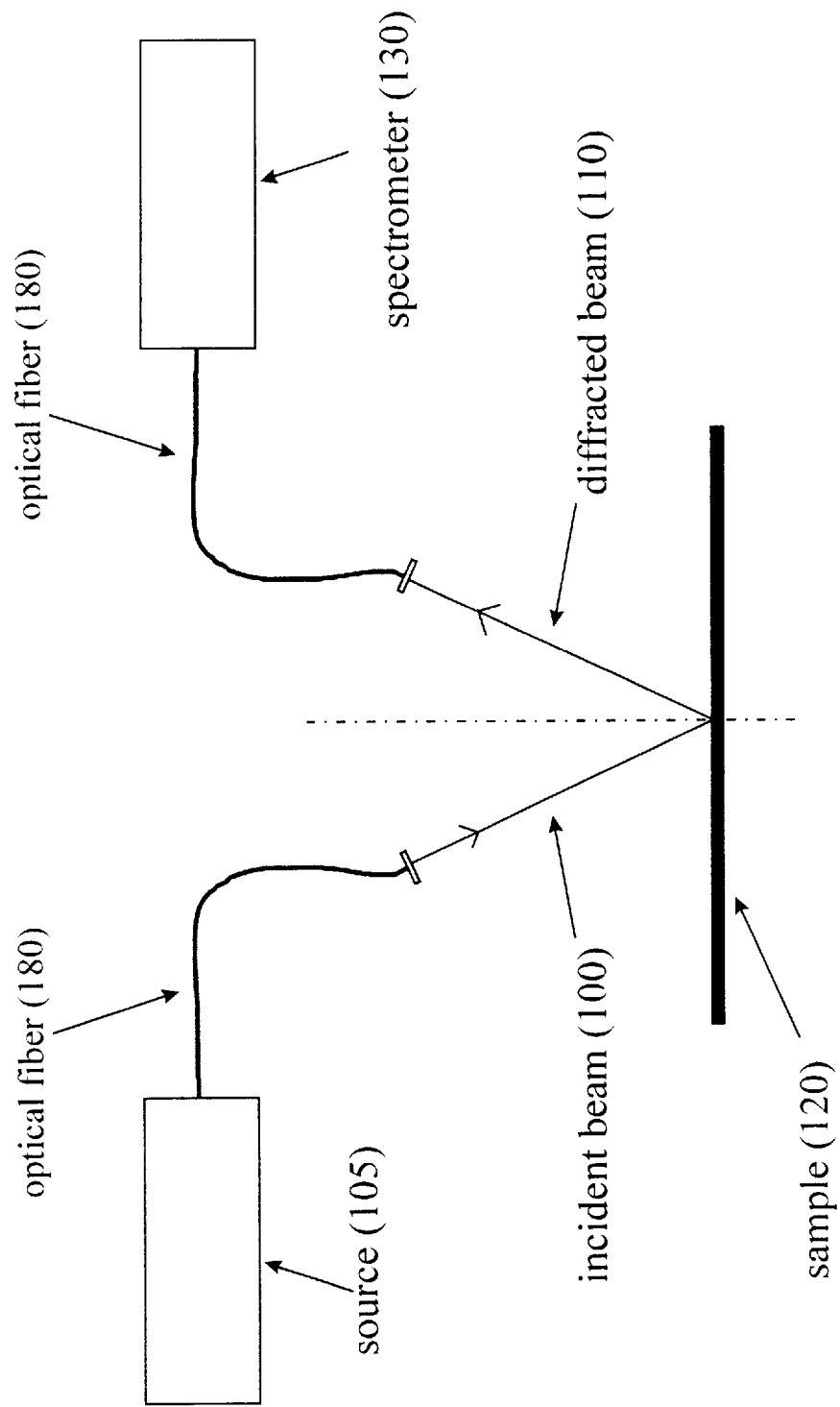
FIG. 4c is a pictorial diagram of a scatterometer system in accordance with the present invention, illustrating the use of an incident beam source, an optical fiber, and a spectrometer for characterizing the light that is diffracted from the sample.

FIG. 4 illustrates arrangements that utilize optical fibers to transmit the incident beam (100) or the diffracted beam (110). The arrangements otherwise function in essentially the same manner as those illustrated in FIG. 3. In FIG. 4a the optical fiber (180) transmits the incident beam (100) for a portion of its path from the source (105) to the sample (120). In FIG. 4b the optical fiber (180) transmits the diffracted beam (110) for a portion of its path from the sample (120) to the spectrometer (130). In FIG. 4c an optical fiber (180) transmits the incident beam (100) for a portion of its path from the source (105) to the sample (120), and another optical fiber (180) transmits the diffracted beam (110) for a portion of its path from the sample (120) to the spectrometer (130). The arrangements of FIGS. 4a, b, and c can be adapted to accommodate a transparent sample in a manner similar to that illustrated in FIG. 3d. In FIG. 4d a single optical fiber (190) transmits the incident beam from the source (105) and the diffracted beam to the spectrometer (130) for a portion of their respective paths. In this particular arrangement the two beams are collinear, and are thus labeled incident and diffracted beam (195) in FIG. 4d.

Figure 5B:
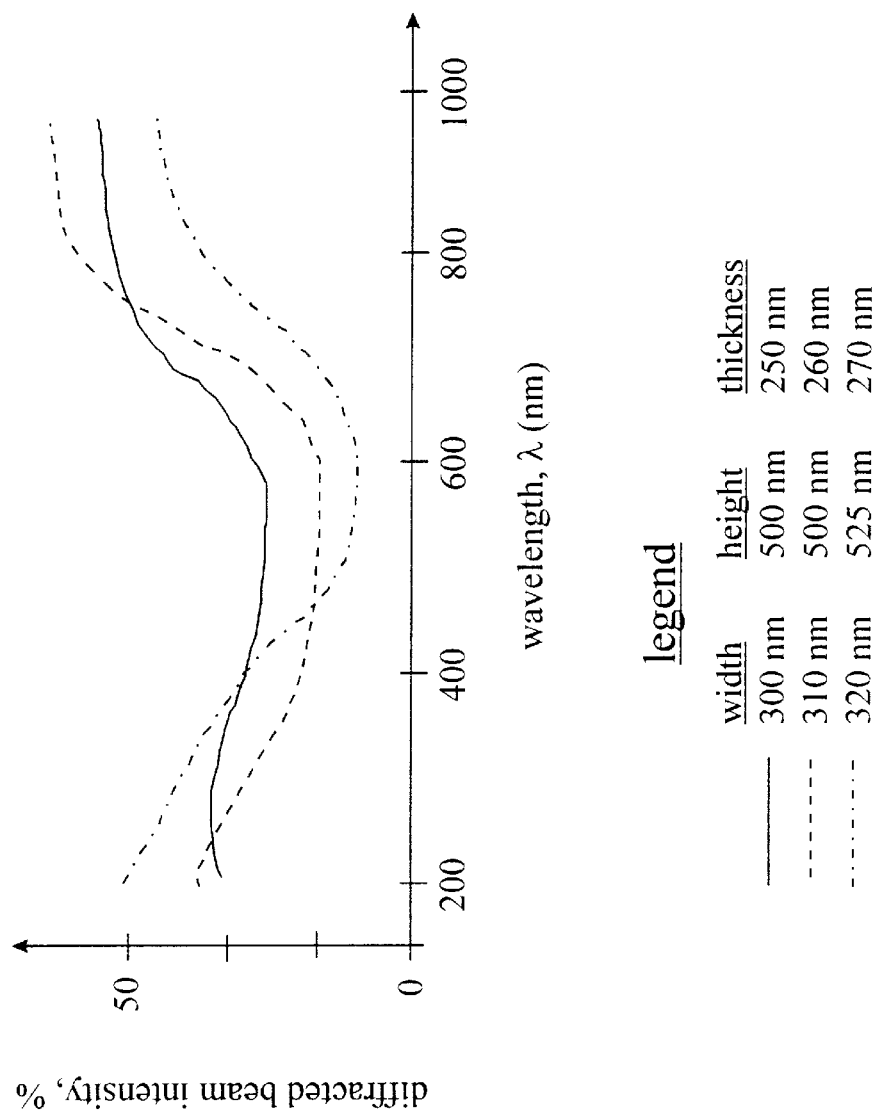
FIG. 5b is a pictorial diagram illustrating the data obtained from the spectrometer as a result of measurement of three samples having different dimensional parameters.

FIG. 5 illustrates the significance of the spectral characteristics of the diffracted beam. FIG. 5a illustrates a cross-sectional view of a sample which is typical of those which might be characterized in application of the invention; specific examples are discussed in the references cited previously. The lines (200) comprise the repeated structure of the diffracting sample. The lines have a width (210) and height (220) which are to be determined; similarly, the slope of the side of the line (i.e., sidewall angle) and more subtle aspects of the line structure, such as complex refractive index, might also be determined in application of the invention. The dimensions of these three elements of the sample might range from tens of microns to sub-tenth-micron, and the materials of the sample might be those commonly encountered in processing the sample, such as photoresist, metals, insulators, and semiconductor materials. The lines might have one underlying thin film (230) or multiple underlying thin films. The films may be patterned with the same pitch (205) as the lines, a different size pitch, or they may be uniform and thus not be patterned. Illustrative data obtained from the spectrometer (130) is shown in FIG. 5b, which consists of three plots of the normalized intensity of the diffracted beam versus wavelength. This illustration corresponds to characterization of three samples which have slightly different dimensions, such as different widths (210) or different heights (220) or different thickness of underlying thin films (230), or more than one of these parameters might change from sample to sample. For the remainder of the description of the invention which follows, this plot will be referred to as the "diffraction characteristic" of the sample. A critical aspect of the invention is that the diffraction characteristic of a sample is extremely sensitive to the sample parameters; small changes in sample parameters cause a significant change in the diffraction characteristic. It is this aspect that is exploited in scatterometry characterization of samples.

An experimental detail which must be performed concerns the data normalization of the diffracted beam (110) by that of the incident beam (100). This will eliminate practical issues from being present in the analysis, such as spectral intensity variations (with respect to wavelength and time) of the incident beam (100), instrumental response of the spectrometer, etc.

Sample Analysis: The specific task that must be accomplished during this component of the invention is to determine the sample parameters of interest, based upon the diffraction characteristic of the sample. This task can be accomplished using a statistical model which must be constructed to accommodate the range of sample parameter values that is anticipated. This can be accomplished in several manners which are appropriate to the invention described herein. Two of these techniques have been described in detail in the following two publications and in the referenced publications cited therein. The first is by S. S. H. Naqvi, et. al., "Etch Depth Estimation of Large-Period Silicon Gratings with Multivariate Calibration of Rigorously Simulated Diffraction Profiles", Journal of the Optical Society of America A, Volume 11, No. 9, pp. 2485–2493, (1994). The second is by Z. R. Hatab, et. al., "Sixteen-Megabit Dynamic Random Access Memory Trench Depth Characterization Using Two-Dimensional Diffraction Analysis", Journal of Vacuum Science and Technology, B, Volume 13(2), Mar/Apr, pp. 174–182, (1995). The samples investigated in these two publications necessarily have large pitch because of the sample illumination and measurement techniques that were utilized. However, while the invention described herein does not have a requirement on the pitch, the analysis techniques of these two references are applicable to this invention.

In the method of this invention, the sample is first parameterized. Use of the term parameterized is understood to mean that the ranges of each of the sample parameters that is anticipated to vary from sample to sample are determined; it is these variable parameters that are to be determined using the invention. Additionally, the term parameterize includes determining the measurement resolution of each parameter. This will establish a parameter space of one or more dimensions, depending upon the number of parameters that are treated as variables, that is subsequently utilized in the analysis. The parameter space will encompass the parameters of all samples that will be measured. There will be a total number of points in the parameter space that is equivalent to the total number of possible sample parameter value combinations. Each parameter combination represents a point in the parameter space. For purposes of illustration, consider an example in connection with the sample having the cross-section structure illustrated in FIG. 5a. It is known that the sample will have a pitch (205) of 700 nm that does not change from sample to sample. Parameters which are anticipated to change from sample to sample are the width (210), the height (220), and the thickness of the underlying thin film (230). The nominal value for the width (210) is 310 nm, and it is anticipated to vary between 300 nm and 320 nm. The nominal value for the height (220) is 500 nm, and it is anticipated to vary between 450 nm and 550 nm. Additionally, the nominal thickness of the underlying thin film (230) is 250 nm, and it is anticipated to vary in thickness between 230 nm and 300 nm. The required measurement resolution of the three variable parameters is 2 nm for the width (210), 25 nm for the height (220), and 10 nm for the thin film (230). Thus the parameter space will be three-dimensional, to accommodate variations in the three parameters. The total number of points in the parameter space is 440, as a result of 11 possible measurement values for the width (210), 5 possible measurement values for the height (220), and 8 possible measurement values for the thickness of the underlying thin film (230); i.e., 11×5×8=440.

The next step of the Sample Analysis is to generate diffraction data that is to be used for calibration of a statistical analysis technique. This diffraction data will be called "callibration data" in the description that follows. The callibration data that is generated correspond to samples that have parameter values which define points in the parameter space. Note that in some instances it may not be feasible to generate callibration data corresponding to every point in the parameter space. To accomplish this, the spectral range and spectral resolution of the incident beam (100) are first determined. The diffraction is determined for each set of sample parameters for which this is desired, and at each wavelength that determines the spectral resolution, over the wavelength range of the incident beam (100). The wavelengths which determine the spectral resolution and at which the diffraction is determined will be called the "discrete wavelengths" of the incident beam in the following description. A diffracted beam (110) is thereby determined that corresponds to a plurality of points in the sample parameter space. This calibration data is subsequently utilized in calibration of a multivariate statistical technique. Continuing the example above given for purposes of illustration, consider the incident beam to have a spectral content that ranges from 200 nm to 1000 nm in wavelength. Also, it is determined that the diffraction data from the samples are to be determined at intervals of 100 nm in order to sufficiently establish the diffraction characteristics of the samples. Thus diffraction data at 9 discrete wavelengths, 200 nm, 300 nm, etc. through 1000 nm are generated. It is also determined that this data will be generated for each of the 440 points in parameter space, thereby determining 440 diffracted beams (110) and 440 diffraction characteristics. This set of 440 diffraction characteristics comprises the calibration data that will be subsequently used. FIG. 5b illustrates the diffraction characteristics corresponding to the three points of parameter space specified in the legend of the figure.

The diffraction characteristics can be generated in two different manners. One manner involves utilization of a mathematically rigorous formalism for computing the grating diffraction. Two examples of this formalism are rigorous coupled wave theory (RCWT) and modal analysis; other techniques exist including finite element, finite difference, and other computational electromagnetic techniques. Typically the grating structural details, including the parameters previously described, the optical properties of the materials involved in the sample construction, and the incident beam wavelength and polarization state are input to model the sample and to compute the diffraction characteristic of the sample. The details of these two techniques are described in the references previously given. The results of the computations consist of the normalized diffraction at the discrete wavelengths of the incident beam (100), thereby establishing a diffracted beam (110) corresponding to each point in parameter space. In this situation the calibration diffraction data that is obtained is theoretically generated.

The second manner of obtaining the diffraction characteristics is to fabricate samples (so-called "calibration samples") that have their range of parameters corresponding to the points in the parameter space. The diffraction characteristics of the calibration samples are first measured using the invention apparatus described here. The samples must then be analyzed by some independent means to determine the values of their parameters. For samples similar to that illustrated in FIG. 5a, cross-sectional scanning electron microscopy, atomic force microscopy, or other microscopy techniques might be utilized for this purpose. In this situation the calibration diffraction data and sample parameter values that are obtained are experimental.

The next step of Sample Analysis consists of training a multivariate statistical analysis technique using the calibration data previously obtained. The statistical analysis technique might be one of several types. One type that can be used for this purpose is one of a general class of statistical techniques called "chemometrics". Chemometrics refers to a broad category of statistical, multivariate analysis techniques that includes partial least squares (PLS), inverse least squares, principal-component regression, and classical least squares. These techniques have been utilized for a over a decade in a wide range of applications that involve multivariate data analysis. Details of the implementation algorithms of the techniques are given in the references cited above as well as the references cited therein. The result of this step of the analysis is to provide a so-called trained analysis technique which has incorporated into it the diffraction characteristics and the associated parameter values for each point in parameter space.

Another type of statistical analysis technique that can be utilized is a simple error criterion minimization technique. For this algorithm, training simply involves storing the diffraction characteristics corresponding to each point in parameter space in a format that can be subsequently utilized for further analysis. This approach has been described by Raymond, et.al., as previously referenced, in which the minimum mean square error (MMSE) technique is applied to scatterometer data.

Another general category of analysis techniques which can be utilized in this step of Sample Analysis includes well-known parameter estimation techniques. Examples of parameter estimation techniques include, for example, neural nets, correlation techniques, pattern recognition techniques, and ad. hoc. techniques.

The last step in the Sample Analysis is to submit the diffraction characteristic from a sample that has unknown parameter values to the trained analysis technique. It is in this step that the sample parameter values are determined. In the case of the analysis technique being a chemometrics technique, the sample data is processed through a series of linear estimators to provide a rapid determination of the sample's parameter values. If a simple error criterion minimization technique is utilized for analysis, the analysis consists of comparing the diffraction characteristic from the sample to the diffraction characteristics which comprise the calibration data. This comparison is performed on a wavelength-by-wavelength basis, for example. The error criterion is structured to provide a quantitative indication of the difference between the diffraction characteristic of the sample and each of the diffraction characteristics of the calibration data. The diffraction characteristic which best matches that of the sample is used to determine the sample parameters. This process, as well as refinements of it are discussed by the cited reference by Raymond, et.al. Note that this last step of the Sample Analysis can be repeated for a large number of different samples that have unknown sample parameters; once the training has been accomplished, the trained analysis technique can be used repeatedly.

Finally, the first two steps of the method of this invention can be utilized in a process monitor application. The Sample Illumination and Sample Measurement steps described previously are performed. The sample diffraction characteristic that is determined can then be utilized to determine if the process in which the sample is fabricated is within desired tolerance limits. This monitoring can be accomplished in-situ, for example, to provide real-time process monitoring. Alternatively, the monitoring might be accomplished after the sample is fabricated. The process might be altered if desired, based upon this monitoring, thereby performing process control. If real-time monitoring is performed, real-time process control is achieved; otherwise, the information is utilized to alter the process subsequent to processing the sample which was characterized.

The sample measurement method for determining the parameters of a patterned sample can be summarized as follows:

1. Illumination of the sample with light that has a broad spectral composition.
2. Measurement of the diffracted beam from the sample using a spectrometer to obtain the spectrally-resolved diffraction characteristic of the sample under analysis.
3. Determining the range and resolution of each of the sample parameters which is treated as a variable, thereby parameterizing the sample. The result of this step is a multidimensional parameter space which will encompass the values of the parameters of all samples which are to be analyzed; each point in this parameter space corresponds to a set of sample parameters. Additionally, the range and resolution of the wavelength of the incident beam used to illuminate the sample is determined.
4. Generation of calibration data that is used to train a multivariate statistical analysis technique. This data comprises the diffraction characteristics (e.g., diffracted beam intensity versus wavelength) corresponding to samples that have parameter values at some or all points in the parameter space. This might be accomplished using many techniques:
   a. The data can be generated using a rigorous formalism for grating diffraction calculations, such as rigorous coupled wave theory (RCWT), modal analysis, finite element, finite difference, and other computational electromagnetic techniques. In this situation the data is theoretical.
   b. The data can be generated using a set of samples that are similar to the samples which will be subsequently measured, and which have parameters that correspond to some or all points in parameter space. The samples will necessarily have the parameter values determined by one or more methods that are independent of the scatterometer measurement, such as microscopy techniques.
5. Train the multivariate statistical analysis technique using the calibration data. The analysis technique might be one of the following:
   a. A chemometrics method, such as partial least squares (PLS), inverse least squares, principal-component regression, and classical least squares
   b. A simple error minimization technique
   c. Parameter estimation techniques, including, for example, neural nets, correlation techniques, pattern recognition techniques, and ad. hoc. techniques
6. Submit the measured diffraction characteristic from the sample under analysis having unknown parameter values to the trained statistical analysis technique. The analysis technique will determine the parameter values of the sample.

Note that implementation of the steps 1 and 2 can be interchanged with that of steps 3, 4, and 5.

Finally, the first two steps of the method of this invention, plus an additional step, can be utilized in process monitor applications as follows:

1. Illumination of the sample with light that has a broad spectral composition.
2. Measurement of the diffracted beam from the sample using a spectrometer to obtain the spectrally-resolved diffraction characteristic of the sample
3. Utilize the spectrally-resolved diffraction characteristic to determine if the process in which the sample is being fabricated is within desired tolerances. The process might be altered if desired, based upon this monitoring, thereby performing process control.

We claim:

1. A method for broad wavelength scatterometry analysis of a patterned sample material having unknown parameter values, the method comprising:

illuminating the sample material with an incident light beam having a broad spectral composition;

measuring a beam of light diffracted from the sample material using a spectrometer to obtain spectrally-resolved diffraction characteristics of the sample material;

determining the range and resolution of each of one or more sample parameters to be treated as one or more variables to thereby parameterize the sample material;

generating calibration data;

training a multivariate statistical analysis technique using the generated calibration data; and submitting the measured diffraction characteristics of the sample material to the trained statistical analysis technique to determine the parameter values of the sample material.

2. A method as in claim 1, further comprising the step of determining the range and resolution of the wavelength of the incident light beam.

3. A method as in claim 1 wherein the calibration data comprise diffraction characteristics corresponding to sample materials having parameters at a plurality of points in a parameter space.

4. A method as in claim 3 wherein the diffraction characteristics comprise intensity and wavelength information corresponding to a plurality of diffracted light beams corresponding to sample materials at the plurality of points in the parameter space.

5. A method as in claim 1 wherein the step of generating calibration data comprises a selected computational electromagnetic technique to obtain theoretical calibration data.

6. A method as in claim 1 wherein the step of generating calibration data comprises generating calibration data using a set of sample materials that are similar to said sample material and having parameter values corresponding to all points in parameter space.

7. A method as in claim 1 wherein the multivariate statistical analysis technique comprises a chemometrics method.

8. A method as in claim 1 wherein the multivariate statistical analysis technique comprises an error minimization technique.

9. A method as in claim 1 wherein the multivariate statistical analysis technique comprises a parameter estimation technique.

10. A method for broad wavelength scatterometry monitoring of a process for fabricating a patterned sample material, the method comprising:

illuminating the sample material with an incident light beam having a broad spectral composition;

measuring a beam of light diffracted from the sample material using a spectrometer to obtain spectrally-resolved diffraction characteristics of the sample material;

utilizing the spectrally-resolved diffraction characteristic of the sample material to determine if the process is within specified tolerances.

11. A method as in claim 10, further comprising the step of controlling the process based upon the spectrally-resolved diffraction characteristics of the sample material.

* * * * *